United States Patent [19]

Jochum

[11] Patent Number: 4,761,605
[45] Date of Patent: Aug. 2, 1988

[54] INPUT SWITCHING IN ELECTRONIC WATTHOUR METER

[75] Inventor: Thomas A. Jochum, Durham, N.C.

[73] Assignee: General Electric Company, Somersworth, N.H.

[21] Appl. No.: 944,313

[22] Filed: Dec. 22, 1986

[51] Int. Cl.⁴ .................... G01R 21/06; G01R 19/18
[52] U.S. Cl. .................................... 324/142; 324/127
[58] Field of Search .................... 324/127, 142; 330/9

[56] References Cited

U.S. PATENT DOCUMENTS

| | | | |
|---|---|---|---|
| 3,916,310 | 10/1975 | Stark et al. | 324/127 |
| 4,182,982 | 1/1980 | Wolf et al. | 324/127 |
| 4,641,105 | 2/1987 | Albaugh et al. | 330/9 |

Primary Examiner—Reinhard J. Eisenzopf
Assistant Examiner—Stephen M. Baker
Attorney, Agent, or Firm—Robert E. Brunson; Thomas R. Morrison

[57] ABSTRACT

An electronic metering circuit includes a current transformer having active feedback for maintaining core flux near zero. In one embodiment of the invention, DC offset-voltage compensation in an operational amplifier providing the active-feedback signal is accomplished using an integrator having a long time constant compared to the time constant of periodic signals. A further embodiment of the invention integrates the functions of current sensing, DC offset-voltage compensation, and part of the switching function required in the electronic metering circuit.

6 Claims, 6 Drawing Sheets

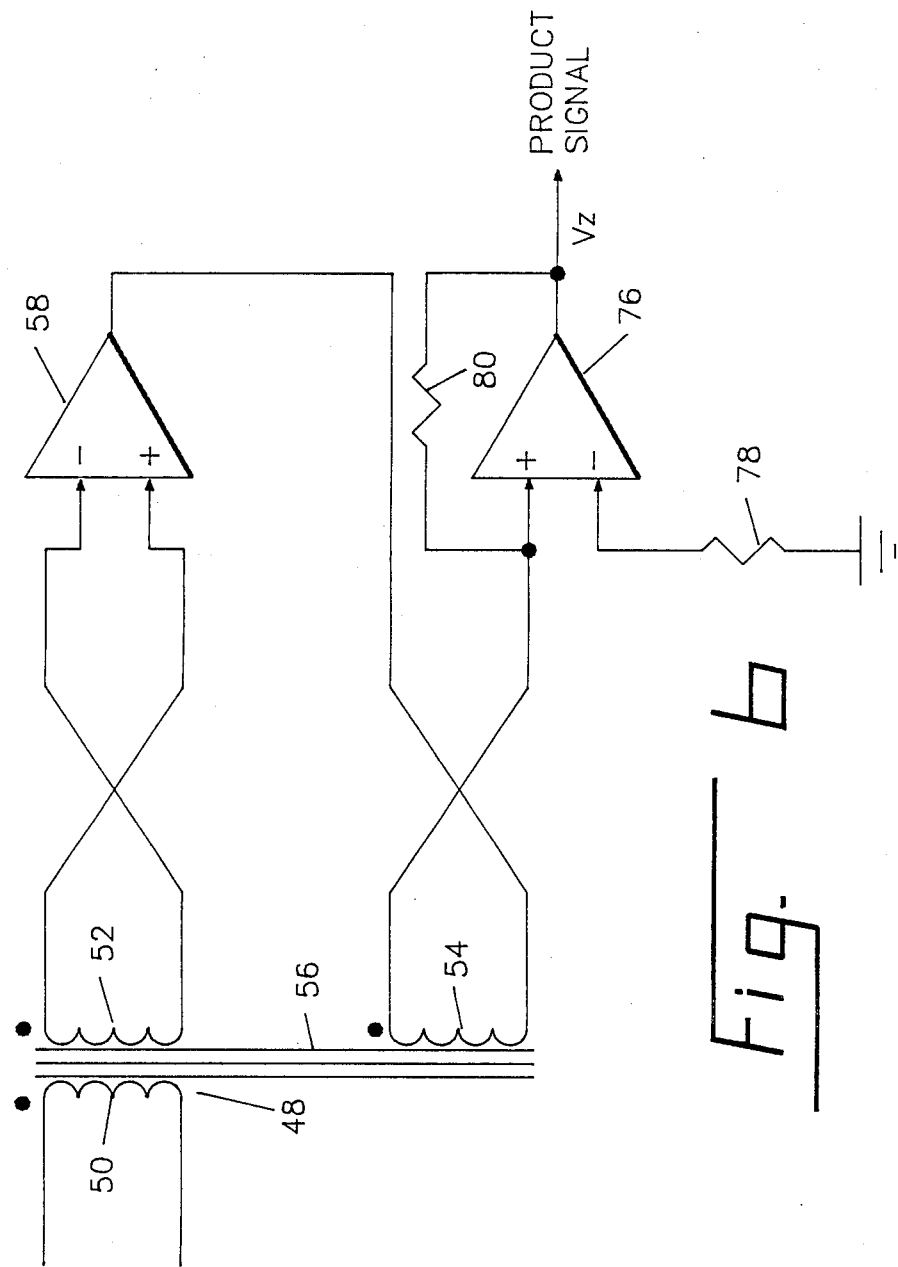

INPUT SWITCHING IN ELECTRONIC WATTHOUR METER

BACKGROUND OF THE INVENTION

The present invention relates to electronic watthour metering and, more particularly, to techniques for overcoming offset voltages at an input of an amplifier serving as part of an active-feedback element in a current transformer feeding an electronic watthour meter.

One type of electronic watthour meter disclosed, for example, in U.S. Pat. Nos. 3,947,763 and 3,955,138 employs a multiplier using a pulse-width-modulated signal having pulse widths ratios related to an instantaneous value of one of line voltage or load current to modulate the instantaneous value of the other thereof. The resulting modulated product signal is proportional to the product of line voltage and line current; that is, to the instantaneous power consumption of the load. The product signal is integrated to produce a sawtooth waveform which triggers an output pulse when its amplitude attains a predetermined value. Upon the production of the output pulse, the direction of integration is reversed until an opposite threshold is attained. Each cycle of the output pulse indicates the consumption of a predetermined quantum of electric energy, conventionally measured in units of watthours or kilowatthours.

The load current is typically many times the value of a current signal appropriate for use in an electronic watthour metering device. In some systems, the load current is as much as 10,000 times larger than the desired current signal. It is conventional to employ a current transformer wherein a small number of turns (for example, one or two) about a toroidal core serve as a primary current-transformer winding carrying the load current. A secondary winding of many turns has induced in it a current proportional to the load current but reduced by the primary-to-secondary turns ratio of the current transformer.

Current transformers are prone to core saturation in the presence of large primary currents. Core saturation conventionally is avoided by using large cores and making the cores of high-quality materials. Both large size and high-quality materials invoke high cost.

One solution for core saturation disclosed, for example, in U.S. patent application Ser. No. 944,028, filed 12/22/86, and the references cited therein, includes providing a feedback winding on the core carrying an inverse current signal just sufficient to maintain the core flux near zero. Limiting the core flux near zero permits using smaller cores and cheaper core materials. As the load current increases, the inverse current signal also increases just enough to maintain the core flux near zero, whereby all levels of load current can be accommodated without experiencing core saturation of the current transformer. The inverse current may, itself, be employed as the output signal from the current transformer.

The active feedback employed in the above-referenced patent application is produced by an operational amplifier receiving the output of the secondary winding of the current transformer. The conventional high gain of an operational amplifier produces an inverse current easily capable of maintaining near zero flux in the core. The high gain of the operational amplifier, however, leads to a further complication. That is, coupling between the feedback winding and the secondary winding of the current transformer is only for alternating current (AC). There is no DC feedback coupling to the input of the operational amplifier. Thus, DC offset voltages of, for example, a fraction of a milliampere may appear at the input of the operational amplifier. Operational amplifiers conventionally have DC gains on the order of several million. As a consequence, any offset voltage, even a fraction of a milliampere, at the input of the operational amplifier is capable of driving the operational amplifier to saturation.

One technique for offset-voltage compensation is disclosed in U.S. patent application Ser. No. 70,794, filed 7/7/87. This device momentarily short-circuits the input of an operational amplifier and stores a sample of any output voltage as a measure of the offset voltage. During subsequent operation, the sample is applied to the input of the operational amplifier along with the input signal. This technique appears to have little value in solving DC offset problems in an operational amplifier producing a negative current signal for maintaining the flux in a current transformer core near zero.

U.S. Pat. No. 4,066,960 discloses compensating for offset voltages by integrating the product signal first in one direction and then in the opposite direction during the half cycles of the output pulse of an electronic watthour meter. Any influence of offset voltages on the length of a half cycle of the output signal is exactly compensated by an equal and opposite effect on the length of the adjacent half cycle. Although useful for avoiding errors in an integrator, this technique is not helpful in the present application since any integration taking place is well downstream of the point at which offset voltage acts.

OBJECTS AND SUMMARY OF THE INVENTION

It is an object of the invention to provide an electronic watthour meter which overcomes the drawbacks of the prior art.

It is a further object of the invention to provide offset voltage compensation in an amplifier producing a negative current signal for maintaining a core of a current transformer.

It is a still further object of the invention to provide DC feedback to an input of an operational amplifier used as part of an active feedback element of a current transformer. The DC feedback means employs a time constant that is long relative to a line frequency and normal current spikes.

It is a still further object of the invention to provide current sensing means having a current transformer with primary, secondary and feedback windings. A current signal induced in the primary winding is fed to an input of an amplifier. The output of the amplifier is fed through the feedback winding in a sense effective for maintaining the core flux near zero. The input connections to the operational amplifier and connections to the feedback windings are reversed periodically, whereby an AC signal, related to the DC offset voltage is fed back to the input of the operational amplifier and the effects of DC offset voltages are eliminated.

It is a still further object of the invention to provide an electronic watthour metering system wherein a current sensor includes a current transformer with primary, secondary and feedback windings. A current signal induced in the primary winding is fed to an input of an amplifier. The output of the amplifier is fed through the feedback winding in a sense effective for maintaining the core flux near zero. The input connections to the operational amplifier and connections to the feedback windings are reversed by a pulse-width modulated signal having a duty ratio related to an instantaneous voltage. The output of the feedback winding is proportional to the instantaneous power consumption. In addition, the switching produces an AC signal, related to the DC offset voltage fed back to the input of the operational amplifier, whereby the effects of DC offset voltages are eliminated.

Briefly stated, the present invention provides an electronic metering circuit including a current transformer having active feedback for maintaining core flux near zero. In one embodiment of the invention, DC offset-voltage compensation in an operational amplifier providing the active-feedback signal is accomplished using an integrator having a long time constant compared to the time constant of periodic signals. A further embodiment of the invention integrates the functions of current sensing, DC offset-voltage compensation, and part of the switching function required in the electronic metering circuit.

According to an embodiment of the invention, there is provided a current sensor comprising: a current transformer, the current transformer including a primary winding, a secondary winding and a feedback winding, means for magnetically coupling together the primary winding, secondary winding and feedback winding, feedback generating means responsive to an AC signal in the secondary winding for producing a feedback signal for application to the feedback winding, the feedback signal having an amplitude and a phase effective for maintaining a flux in the means for magnetically coupling near zero, and means for producing a signal effective for compensating a DC offset voltage in the feedback generating means.

According to a feature of the invention, there is provided an electronic watthour metering system comprising: means for producing a current signal having an amplitude proportional to a load current, means for producing a voltage signal having an amplitude proportional to a voltage applied to the load, means for producing a pulse-width-modulated signal having a duty ratio related to and amplitude of the voltage signal, the means for producing a current signal including: a current transformer, the current transformer including a primary winding, a secondary winding and a feedback winding on a common core, an operational amplifier responsive to an AC signal in the secondary winding for producing a feedback signal for application to the feedback winding, the feedback signal having an amplitude and a phase effective for maintaining a flux in the means for magnetically coupling near zero, a first switch assembly, the first switch assembly including a first pair of switches effective when closed to connect first and second ends of the secondary winding to first and second inputs, respectively, of the operational amplifier, the first switch assembly including a second pair of switches effective when closed to connect the first and second ends of the secondary winding to second and first inputs, respectively, of the operational amplifier, a second switch assembly, the second switch assembly including a third pair of switches effective when closed to connect an output of the operational amplifier to a third end of the feedback winding and to connect a fourth end of the feedback winding to a succeeding circuit, the second switch assembly including a fourth pair of switches effective when closed to connect the output of the operational amplifier to the fourth end of the feedback winding and to connect the third end of the feedback winding to the subsequent circuit, and means responsive to the pulse-width-modulated signal for alternately closing the first and third pairs of switches while opening the second and fourth pairs of switches and for opening the first and third pairs of switches while closing the second and fourth pairs of switches whereby an AC signal related to a DC offset voltage is coupled to the operational amplifier through the means for magnetically coupling.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 6 is a schematic diagram of the current sensor of FIG. 4 in the other of its switch configurations.

DETAILED DESCRIPTION OF THE PREFERRED EMBODIMENT

Figure 1:
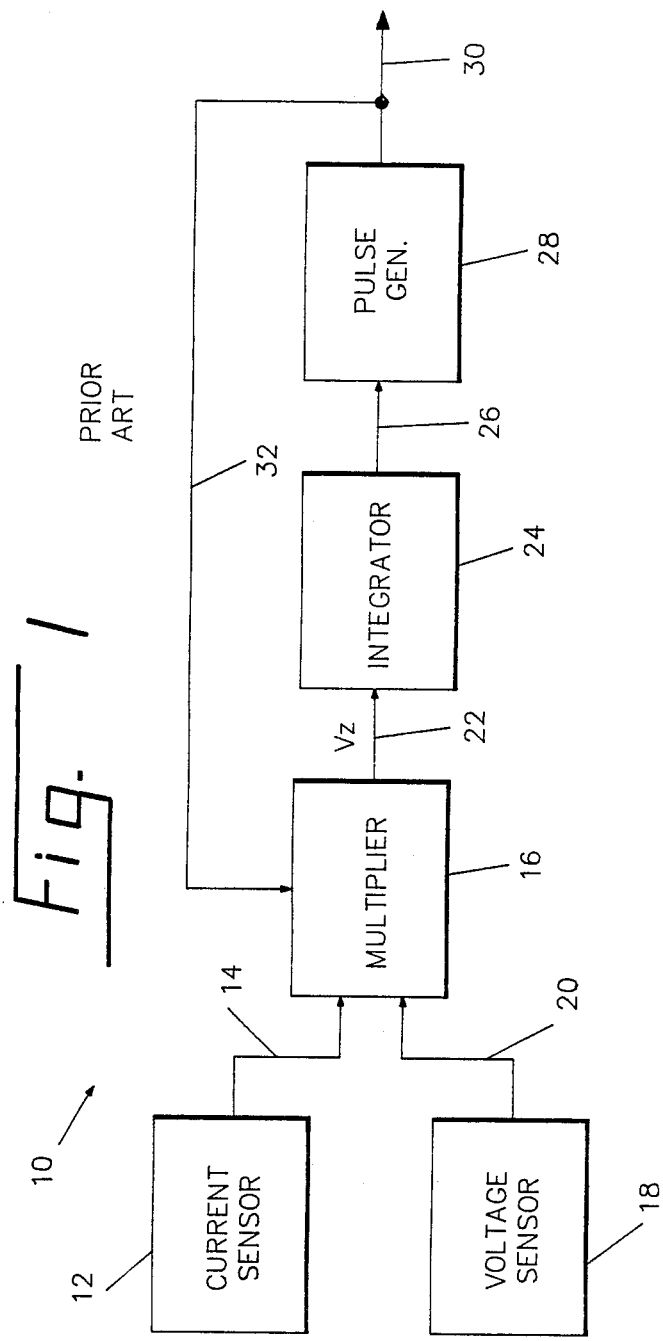
FIG. 1 is a block diagram of an electronic metering system according to the prior art.

Referring to FIG. 1, there is shown, generally at 10, a generalized representation of relevant parts of an electronic watthour meter according to the referenced prior patents. A current sensor 12 produces a signal proportional to a current consumed by a load (not shown) for application on a line 14 to a multiplier 16. A voltage sensor 18 produces a signal proportional to a line voltage for application on a line 20 to multiplier 16. In the referenced patents, multiplier 16 produces a pulse-width-modulated signal having a duty ratio controlled by one of the input signals and an amplitude controlled by the other of the input signals. The pulse-width-modulated product signal Vz, proportional to instantaneous power consumption, is applied on a line 22 to an integrator 24. Integrator 24 produces an output signal having a slope proportional to the instantaneous power consumption for application on a line 26 to a pulse generator 28.

As is conventional, pulse generator 28 includes a threshold detector effective for producing alternately a positive-going and a negative-going transition in its output upon the magnitude of the integrated signal on pulse generator 28 reaching a predetermined negative and positive value, respectively. Each cycle of the resulting pulse signal contains a predetermined significance in energy consumption such as, for example, a predetermined quantum of watthours of energy consumption. The pulse signal is applied on a line 30 to a conventional counter (not shown) or external circuits for accumulating the energy consumption for billing or other purposes. The pulse signal is also applied on a feedback line 32 to multiplier 16 for reversing the sense of the product signal Vz, whereby the integrated signal on line 26 is a sawtooth waveform having positive and negative peaks of equal magnitude.

Figure 2:
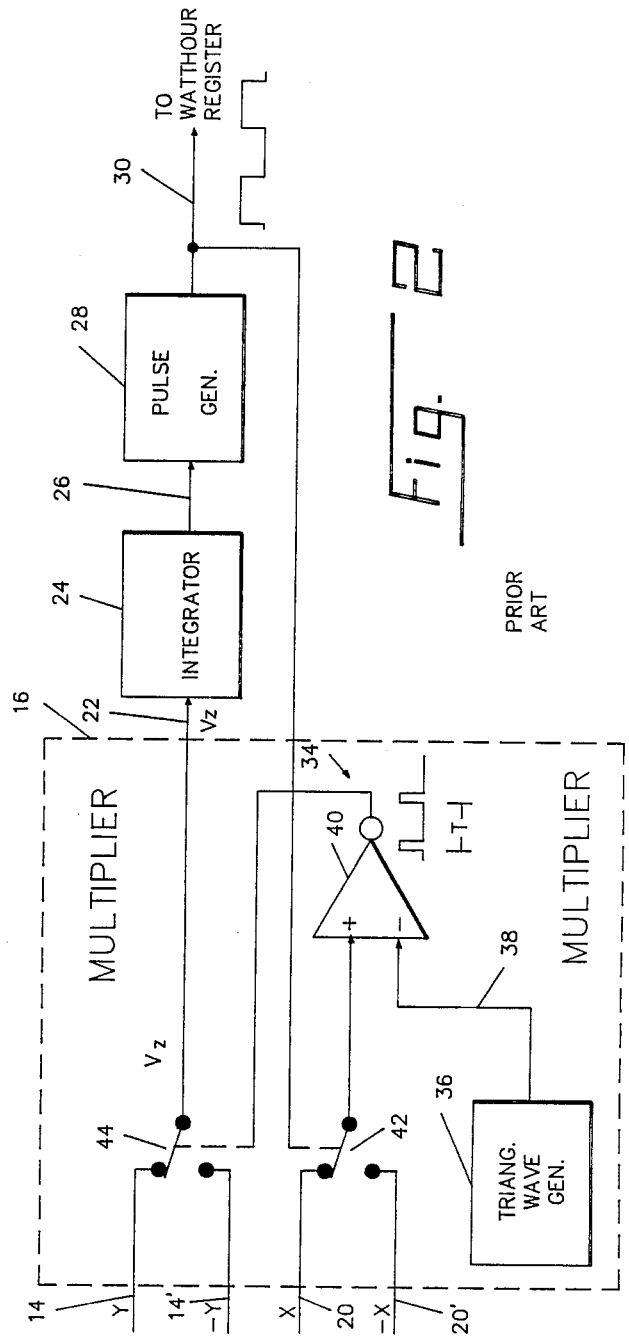
FIG. 2 is a block diagram of the apparatus of FIG. 1 with the contents of the multiplier thereof detailed.

Referring now to FIG. 2, multiplier 16 includes a pulsewidth modulator 34 including a triangular-wave generator 36 producing a fixed-frequency and fixed-amplitude triangular wave for application on a line 38 to an input of a threshold circuit 40. A switch 42, reversed each time the pulse signal on feedback line 32 completes a half cycle, alternately applies a voltage signal X on line 20 or the inverse voltage signal $-X$ on line 20' to the second input of threshold circuit 40. The output of threshold circuit 40, a pulse-width-modulated signal having a constant period T (or equivalently, a constant frequency 1/T) and a duty ratio (ratio of ON time to OFF time) related to the amplitude of the voltage signal applied through switch 42 to threshold circuit 40, is employed to control a switch 44. The two input terminals of switch 44 receive a current signal Y on line 14 and the inverse current signal $-Y$ on line 14'. The output of switch 44 is product signal Vz, a pulse-width-modulated signal having a duty ratio responsive to the voltage signal X or its inverse $-X$, and an amplitude responsive to the amplitude of the current signal Y and its inverse $-Y$.

In the prior art, current sensor 12 (FIG. 1) is a center-tapped current transformer including a primary winding (not shown) of a small number of turns (typically one or two) and a secondary winding of a large number of turns. The resulting current transformation is required to produce a current signal on line 14 on the order of milliamperes or millivolts from a primary current on the order of tens or hundreds of amperes. Maintaining the core of such a current transformer in the unsaturated condition requires a core of a large physical size and of expensive material.

Voltage sensor 18 of the prior art (FIG. 1) is a center-tapped voltage transformer with a transformer ratio effective to produce voltage signals at a level appropriate for the electronic circuits in multiplier 16.

Figure 3:
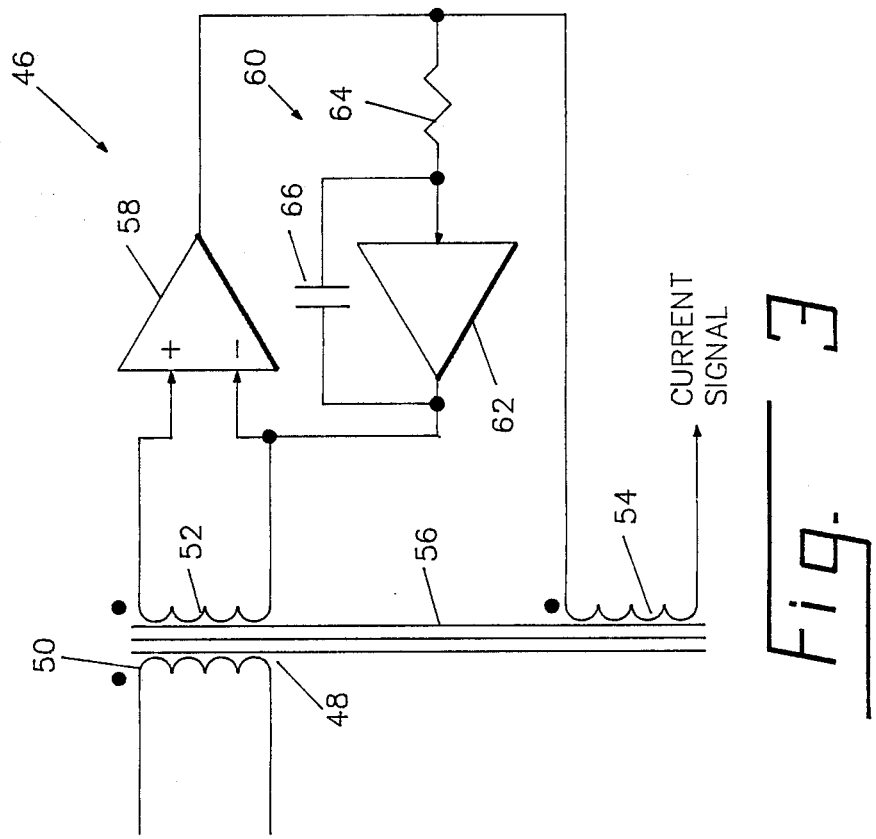
FIG. 3 is a schematic diagram of a current sensor according to the present invention.

Referring now to FIG. 3, there is shown, generally at 46, a current sensor including means for overcoming the problem of core saturation in a prior-art current transformer. A current transformer 48 includes a primary winding 50, a secondary winding 52, and a feedback winding 54, all wound on a common core 56. The two ends of secondary winding 52 are connected to inputs of an operational amplifier 58. The output of operational amplifier 58 is applied through feedback winding 54. The output of feedback winding 54 is the desired current signal.

When poled as shown, the high gain of a typical operational amplifier 58 produces a voltage across feedback winding 54 sufficient to cancel substantially all of the flux in core 56 and thereby to avoid saturation of core 56, thus permitting the use of cores of small size and reasonable cost.

A problem remains, however, in providing means for avoiding saturation of operational amplifier 58 due to offset voltage. Insofar as it has been described in the preceding, only AC feedback coupling exists between feedback winding 54 and secondary winding 52. No means for DC feedback is yet described. Thus, no means for DC offset voltage compensation is yet discussed. Such DC offset voltage compensation is provided by an integrator 60 consisting of an amplifier 62 receiving the output voltage of operational amplifier 58 through a resistor 64 and with an integrating capacitor 66 connected between its output and its input. The output voltage of amplifier 62 is applied to the inverting input of operational amplifier 58. The time constant of integrator 60 is long relative to the period of the primary current, and any other periodic signal which may be present. A time constant on the order of seconds may be used. With such a long time constant, integrator 60 responds essentially to the DC component in the output of operational amplifier 58 and generally ignores the AC component. This DC component, fed back to operational amplifier 58 cancels DC offset voltages, as is desired.

The embodiment of the invention shown in FIG. 3 responds in an oscillatory manner to step changes in load current as may be produced, for example, by the starting or stopping of a large motor. In some applications, such oscillatory response may be undesirable.

Figure 4:
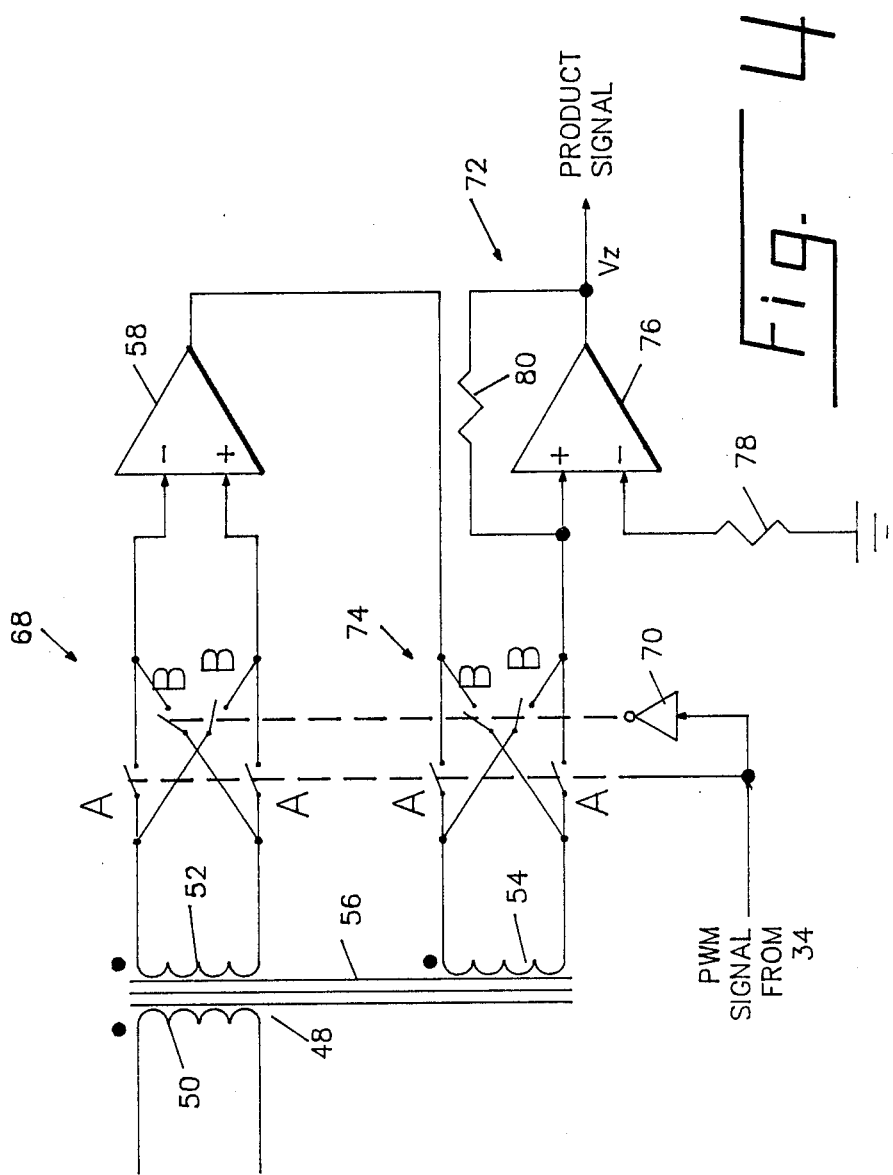
FIG. 4 is a schematic diagram of a further current sensor according to the present invention.

A further improved embodiment of the invention is shown in FIG. 4 wherein the functions of preventing core saturation, DC offset-voltage compensation, and part of the multiplier function are integrated. The two ends of secondary winding 52 of current transformer 48, corresponding to that of FIG. 3, are connected to inputs of operational amplifier 58 through a reversing switch assembly 68. Reversing switch assembly 68 contains one pair of switches labelled A and a second pair of switches labelled B. Switches A and B are driven by complementary pulse-width-modulated signals responsive to the voltage in a manner corresponding to that described in connection with FIG. 2. That is, switches A are driven directly by the pulse-width-modulated signal, and switches B are driven by its inverse produced, for example, by an inverter 70. One of switch pairs A and B is closed, and the other is open.

The output of operational amplifier 58 is connected to feedback winding 54, and the output of feedback winding 54 is connected to an output amplifier 72 through a second switch assembly 74. Switch assembly 74 includes a pair of switches labelled A, driven by the pulse-width-modulated signal in common with corresponding A switches in reversing switch assembly 68, and a pair of switches B driven by the inverse of the pulse-width-modulated signal in common with corresponding B switches in reversing switch assembly 68.

Output amplifier 72 includes an operational amplifier 76 having an input resistor 78 connected from its inverting input to ground, and a feedback resistor 80 connected from its output to its input. Output amplifier 72 maintains a virtual ground at its non-inverting input, with its output voltage increasing as necessary to maintain this condition. The output of operational amplifier 76 is the desired product signal Vz.

Figure 5:
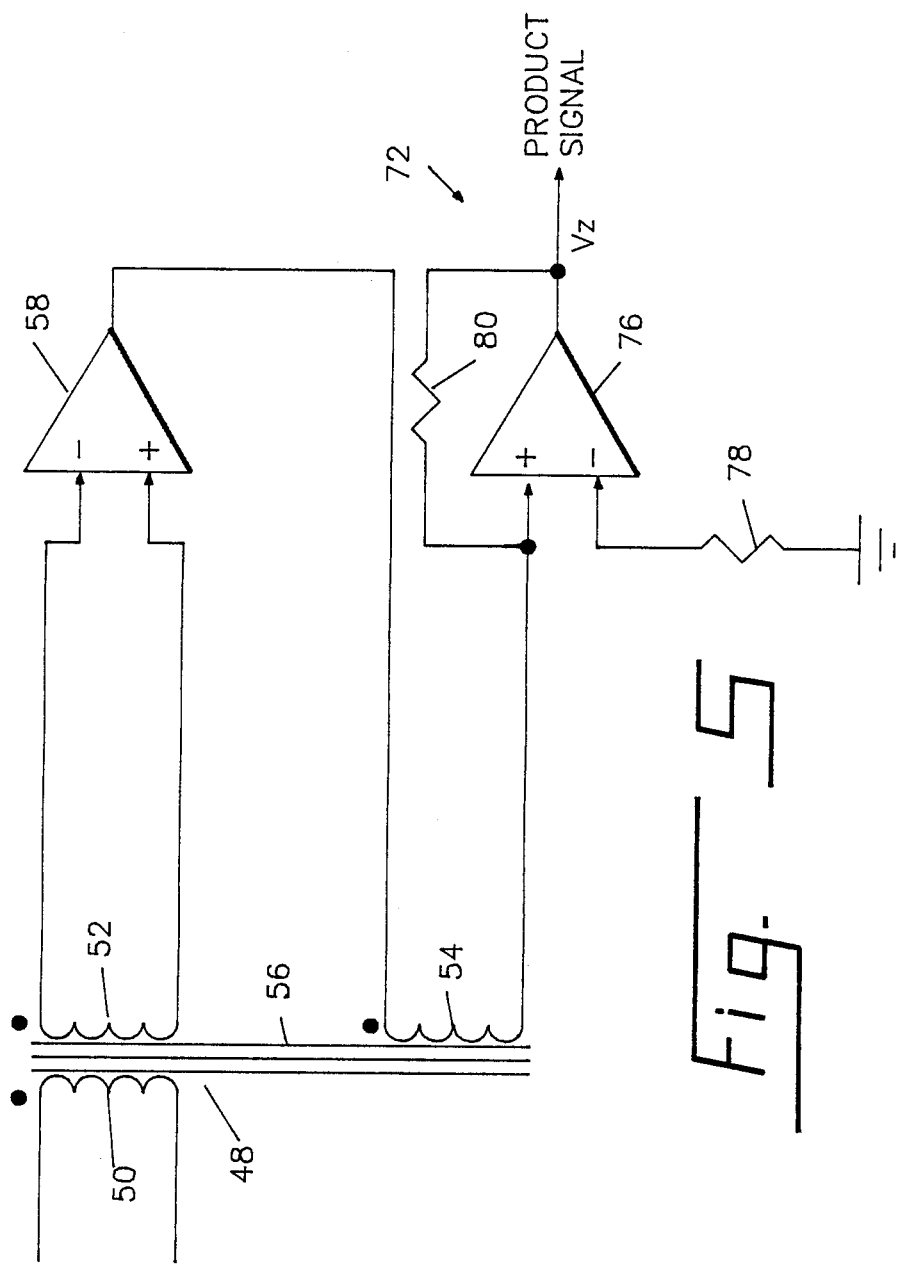
FIG. 5 is a schematic diagram of the current sensor of FIG. 4 in one of its switch configurations.

Referring now to FIG. 5, the condition of the circuit of FIG. 4 is shown while all A switches are closed, and all B switches are open and omitted from the figure for purposes of description. It will be noted that this configuration corresponds to that shown in FIG. 3 with integrator 60 omitted. The alternate configuration, with all B switches closed and all A switches open and omitted from the drawing, is shown in FIG. 6.

It will be clear to one skilled in the art that any DC component in the output of operational amplifier 58 is converted to a corresponding AC signal by the switching between the configurations in FIGS. 5 and 6. The AC signal derived from DC offset voltages is coupled through current transformer 48 back to the input of operational amplifier 58 which thereupon produces a compensating component of output to maintain the effect of DC offset close to zero.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What I claim is:

1. A current sensor comprising:
   a current transformer;
   said current transformer including a primary winding, a secondary winding and a feedback winding;
   means for magnetically coupling together said primary winding, said secondary winding and said feedback winding;
   feedback generating means responsive to an AC signal in said secondary winding for producing a feedback signal for application to said feedback winding, said feedback signal having an amplitude and a phase effective for maintaining a flux in said means for magnetically coupling near zero; and
   an operational amplifier in said feedback generating means;
   a first switch assembly;
   said first switch assembly including a first pair of switches effective when closed to connect first and second ends of said secondary winding to first and second inputs, respectively, of said operational amplifier;
   said first switch assembly including a second pair of switches effective when closed to connect said first and second ends of said secondary winding to said second and first inputs, respectively, of said operational amplifier;
   a second switch assembly;
   said second switch assembly including a third pair of switches effective when closed to connect an output of said operational amplifier to a third end of said feedback winding and to connect a fourth end of said feedback winding to a subsequent circuit;
   said second switch assembly including a fourth pair of switches effective when closed to connect said output of said operational amplifier to said fourth end of said feedback winding and to connect said third end of said feedback winding to said subsequent circuit;
   first means for repetitively alternately closing said first and third pairs of switches while opening said second and fourth pair of switches;
   second means for repetitively alternately opening said first and third pairs of switches while closing said second and fourth pairs of switches; and
   said first and second means operating their respective switches synchronously with respect to each other, whereby an AC signal relative to a DC offset voltage is coupled to said operational amplifier through said means for magnetically coupling.

2. a current sensor according to claim 1 wherein said means for magnetically coupling includes a common core in said primary winding, said secondary winding and said feedback winding.

3. A current sensor according to claim 1 wherein said means for producing a signal includes an integrator, said integrator having a time constant that is long compared to periodic signals applied to said current sensor, an integrated output of said integrator being connected to an input of said feedback generating means.

4. A current sensor according to claim 1 wherein said first and second means include means for performing said opening and closing and said closing and opening at a duty cycle responsive to a voltage, whereby a signal fed to said subsequent circuit is proportional to a power consumed by a load.

5. A current sensor according to claim 1 wherein said subsequent circuit includes means for maintaining its input at virtual ground.

6. An electronic watthour metering system for measuring electric energy consumed by a load, comprising:
   means for producing a current signal having an amplitude proportional to a load current;
   means for producing a voltage signal having an amplitude proportional to a voltage applied to said load;
   means for producing a pulse-width-modulated signal having a duty ratio related to an amplitude of said voltage signal;
   said means for producing a current signal including:
   a current transformer;
   said current transformer including a primary winding, a secondary winding and a feedback winding on a common core;
   an operational amplifier responsive to an AC signal in said secondary winding for producing a feedback signal for application to said feedback winding, said feedback signal having an amplitude and a phase effective for maintaining a flux in said common core near zero;
   a first switch assembly;
   said first switch assembly including a first pair of switches effective when closed to connect first and second ends of said secondary winding to first and second inputs, respectively, of said operational amplifier;
   said first switch assembly including a second pair of switches effective when closed to connect said first and second ends of said secondary winding to said second and first inputs, respectively, of said operational amplifier;
   a second switch assembly;
   said second switch assembly including a third pair of switches effective when closed to connect an output of said operational amplifier to a third end of said feedback winding and to connect a fourth end of said feedback winding to a succeeding circuit;
   said second switch assembly including a fourth pair of switches effective when closed to connect said output of said operational amplifier to said fourth end of said feedback winding and to connect said third end of said feedback winding to said subsequent circuit; and
   means responsive to said pulse-width-modulated signal for alternately closing said first and third pairs of switches while opening said second and fourth pairs of switches and for opening said first and third pairs of switches while closing said second and fourth pairs of switches, whereby an AC signal related to a DC offset voltage is coupled to said operational amplifier through said common core.

* * * * *